United States Patent
Yamazaki (10) Patent No.: US 7,773,642 B2
(45) Date of Patent: Aug. 10, 2010

(54) TUNABLE LASER

(75) Inventor: Hiroyuki Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 294 days.

(21) Appl. No.: 10/594,307

(22) PCT Filed: Mar. 29, 2005

(86) PCT No.: PCT/JP2005/005924

§ 371 (c)(1), (2), (4) Date: Sep. 27, 2006

(87) PCT Pub. No.: WO2005/096462

PCT Pub. Date: Oct. 13, 2005

(65) Prior Publication Data

US 2008/0232409 A1  Sep. 25, 2008

(30) Foreign Application Priority Data

Mar. 31, 2004  (JP) .............................. 2004-103022

(51) Int. Cl.
*H01S 3/10* (2006.01)
(52) U.S. Cl. ..................... 372/20; 372/34; 372/69; 372/92; 372/94; 372/99
(58) Field of Classification Search .............. 372/19, 372/94, 20, 34, 69, 92, 99
See application file for complete search history.

(56) References Cited

U.S. PATENT DOCUMENTS 4,852,117 A * 7/1989 Po ................................ 372/97

(Continued)

FOREIGN PATENT DOCUMENTS

CN   2322325 Y   6/1999

(Continued)

OTHER PUBLICATIONS

Chinese Office Action dated Nov. 9, 2007 with English Translation.

(Continued)

*Primary Examiner*—Minsun Harvey
*Assistant Examiner*—Yuanda Zhang
(74) *Attorney, Agent, or Firm*—McGinn IP Law Group, PLLC (57) ABSTRACT

To provide a tunable laser with high reliability and high performance, and of low cost.

A tunable laser (10) comprises a double ring resonator (11) where ring resonators (111, 112) of different sizes are coupled through a directional coupler (122), an LD side waveguide (13) connected at one end (131) to the ring resonator (111) through a directional coupler (123), a reflection side waveguide (14) connected at one end (141) to the ring resonator (112) through a directional coupler (123), a PLC board (15) on which the ring resonator (111) and the like are formed, a high reflection film (16) provided at the other end (142) of the reflection side waveguide (14), an LD chip (17) having a low reflection film (18) formed on either of two opposing emission end faces (171, 172) and coupled optically with the other end (132) of the LD side waveguide (13), and film-like heaters (191-194) for varying the resonance wavelength of the double ring resonator (11).

20 Claims, 11 Drawing Sheets

U.S. PATENT DOCUMENTS

| | | | |
|---|---|---|---|
| 6,009,115 A * | 12/1999 | Ho | 372/92 |
| 6,052,222 A | 4/2000 | Kitamura | |
| 6,091,744 A | 7/2000 | Sorin et al. | |
| 6,411,752 B1 * | 6/2002 | Little et al. | 385/17 |
| 6,643,421 B1 * | 11/2003 | Chin et al. | 385/15 |
| 6,668,006 B1 * | 12/2003 | Margalit et al. | 372/97 |
| 6,891,865 B1 * | 5/2005 | Ma | 372/20 |
| 6,959,028 B2 * | 10/2005 | Jones | 372/94 |
| 2003/0202555 A1 | 10/2003 | Liu et al. | |
| 2003/0219045 A1 | 11/2003 | Orenstein et al. | |

FOREIGN PATENT DOCUMENTS

| | | |
|---|---|---|
| EP | 0 851 548 A1 | 7/1998 |
| EP | 0 930 679 A2 | 7/1999 |
| GB | 2 376 532 A | 12/2002 |
| JP | 62-100706 | 5/1987 |
| JP | 63-281104 | 11/1988 |
| JP | 2-252279 | 10/1990 |
| JP | 3-54529 | 3/1991 |
| JP | 5-347452 | 12/1993 |
| JP | 10-261837 | 9/1998 |
| JP | 11-191656 | 7/1999 |
| JP | 11-251690 | 9/1999 |
| JP | 2000-277849 | 10/2000 |
| JP | 2002-164614 | 6/2002 |
| WO | WO 03/065091 A2 | 8/2003 |
| WO | WO 03/071641 A2 | 8/2003 |

OTHER PUBLICATIONS

European Search Report dated Apr. 29, 2008.
Kourou Kobayashi, "Optical-Integrated Device", Kyoritsu Shuppan Co., Ltd. second impression of the first edition, pp. 104-122, Dec. 25, 2000.
European Office Action dated Jan. 28, 2010.
Chinese Office Action dated Jan. 22, 2010 with English translation thereof.

* cited by examiner

TUNABLE LASER

TECHNICAL FIELD

The present invention relates to a tunable laser that is used in a WDM (Wavelength Division Multiplexing) transmission system and the like, for example.

BACKGROUND ART

Into the era of broadband, in order to achieve efficient utilization of optical fibers, there has been more introduction of a WDM transmission system that is capable of performing communication with a plurality of optical wavelengths using a single system. Recently, it has become popular to use a DWDM apparatus (Dense Wavelength Division Multiplexing Apparatus) which multiplexes several tens of optical wavelengths and enables transmission at still higher rate. In accordance with this, each WDM transmission system requires light sources that correspond to each of the optical wavelengths, and the required numbers thereof have dramatically increased in accordance with the high-multiplexing. Furthermore, ROADM (Reconfigurable optical add/drop multiplexers) which add and drop optional wavelengths at each node have recently been investigated for commercial use. Introduction of this ROADM system increases the transmission capacity by multiplexing the wavelengths and, in addition, enables switching of the optical paths through changing the wavelengths. Therefore, the flexibility of optical network is dramatically improved.

As the light source for the WDM transmission system, DFB-LD (Distributed feedback laser diode) performing uniaxial-mode oscillation has been used widely because it is easy to handle and highly reliable. In the DFB-LD, a diffraction grating with a depth of about 30 nm is formed over the entire region of a resonator, and a stable uniaxial mode oscillation can be obtained with a wavelength that corresponds to a product of the diffraction grating period and twice the equivalent refractive index. However, the DFB-LD is not capable of performing tuning over a wide range of the oscillation wavelengths, so that the WDM system is constituted by using articles that are different only in terms of the wavelength for each ITU grid. Thus, it is necessary to use different articles for each wavelength, which causes an increase in the cost for managing the articles for each wavelength, and requires a surplus stock for dealing with breakdown, etc. Furthermore, if a regular DFB-LD is used in the ROADM that switches the optical paths by the wavelengths, the tunable width of the range of the wavelengths that can be changed with a temperature change is limited to about 3 nm. Thus, it becomes difficult to constitute the optical network that utilizes the characteristic of the ROADM, which is to use the wavelength resource actively.

For overcoming such shortcomings of the current DFB-LD and achieving uniaxial-mode oscillation with a wide range of wavelengths, researches of the tunable laser have been conducted vigorously. Conventional tunable lasers will be described below by referring to some of the examples described in detail in Non-Patent Literature 1.

Tunable lasers can be classified roughly into two types; one is a type where a tuning mechanism is provided within a laser element and the other is a type where a tuning mechanism is provided outside the laser element.

For the former case, there has been proposed a DBR-LD (Distributed Bragg reflector laser diode) in which an active region for generating the gain and a DBR region for generating reflection by the diffraction grating are formed within the same laser element. The tunable range of the DBR-LD is about 10 nm at the most. Further, there has also been proposed a DBR-LD using non-uniform diffraction grating, in which the active region for generating the gain and the DBR regions sandwiching the active regions from the front and rear are formed within the same laser element. The DBR regions in the front and rear generate a great number of reflection peaks by the non-uniform diffraction grating, and the intervals of the reflection peaks are slightly shifted in the front and the rear. So-called "Vernier effect" can be achieved through this structure, so that it becomes possible to perform tuning over an extremely wide range of wavelengths. The DBR-LD using the non-uniform diffraction grating has achieved tuning action of more than 100 nm and quasi-continuous tuning action of 40 nm.

For the latter case, there has been proposed a tunable laser that returns the light of a certain wavelength by rotating the diffraction grating provided outside the laser element.

[Non-Patent Literature 1]"Optical Integrated Device" by Kohroh Kobayashi, $2^{nd}$ Impression of $1^{st}$ Edition, KYORITSU SHUPPAN CO., LTD, December 2000, pp. 104-122

DISCLOSURE OF THE INVENTION

However, even though there have been a great number of structures proposed as the conventional tunable lasers, there are shortcomings such as generation of mode hopping, complicated method of wavelength control, low oscillation resistibility, high price due to an increase in the number of elements, etc. Therefore, it has been still difficult to put them into a practical use.

In the DBR-LD, carrier injection is performed to the DBR region for changing the refractive index in the DBR region for achieving the tuning action. Thus, if crystal defects increase due to the injection of the electric current, the proportion of changes in the refractive index with respect to the current injection fluctuates strikingly. Therefore, it is difficult to maintain the laser oscillation with a constant wavelength over a long time. Furthermore, with the current process technique of a compound semiconductor, inch-up of two inches or more is impossible. Thus, it is difficult to cut the cost from that of the current state with the laser element that has become complicated and large-scaled.

In the laser element where the tuning mechanism is provided outside the laser element, mode jump is easily generated by the oscillation. Thus, it requires a large-scaled oscillation-resistant mechanism for avoiding the mode jump, which results in large-scaled module and increased price.

The object of the present invention is to overcome the shortcomings of the conventional tunable lasers that have been obstacles for putting them into practical use, and to provide a highly reliable, high-performance, and low-price tunable laser.

In order to achieve the foregoing object, a tunable laser according to the present invention comprises: a multiple ring resonator in which a plurality of ring resonators, which are constituted with ring-type waveguides having optical path lengths different from each other, are coupled through an optical-coupling device; an LD-side waveguide whose one end is connected to one of the plurality of ring resonators through an optical-coupling device; a reflection-side waveguide whose one end is connected to other one of the plurality of ring resonators through an optical-coupling device; a single board on which the ring resonator, the LD-side waveguide and the reflection-side waveguide are formed; a reflection film provided to other end of the reflection-side waveguide; a laser diode chip (referred to as LD chip hereinafter) having a low reflection film formed on one of two opposing emission end faces, which is optically coupled to the LD-side waveguide through the low reflection film; and a tuning device for changing resonance wavelength of the multiple ring resonator. Directional couplers may be used as the optical-coupling devices. Further, a lens may be used as the optical device.

The light emitted from the LD chip returns through the route of the low reflection film→the LD-side waveguide→the multiple ring resonator→the reflection-side waveguide→the reflection film→the reflection-side waveguide→the multiple ring resonator→the LD-side waveguide→the low reflection film. The wavelength of this return light is the resonance wavelength of the multiple ring resonator. The reason is that the FSRs (Free Spectral Range) of each ring resonator constituting the multiple ring resonator are slightly different from each other, so that there generates still larger reflection at the wavelength (resonance wavelength) where the periodic changes of the reflections (transmissions) generated in each of the ring resonators meet with each other. The wavelength where the periods become consistent changes according to the circumferential lengths of each ring resonator and the changes in the waveguide refractive indexes, so that efficient tuning action can be obtained. The waveguide refractive index can be changed by the thermooptic effect. The thermooptic effect is a phenomenon in which the refractive index of a material is increased by heat, which can normally be observed in any kinds of materials. In other words, it is possible to change the resonance wavelength of the multiple ring resonator by utilizing the temperature properties of a plurality of ring resonators. The tuning device may be either type that heats or cools the ring resonator. As described above, the present invention constitutes the multiple ring resonator through connecting a plurality of ring resonators with slightly different circumferences in series, and utilizes the Vernier effect generated thereby.

The multiple ring resonator contains at least two or more of the ring resonators. When constituting the multiple ring resonator by using two ring resonators, it can be formed with the simplest structure. At the same time, it is possible to change the resonance wavelength of the double ring resonator easily through controlling the temperatures of the two ring resonators. In the multiple ring resonator constituted with the N-number of ring resonators, for example, it resonates at the wavelength where the resonance wavelengths of the N-number of ring resonators all become consistent. That is, since the temperatures of the N-number of ring resonators are to be controlled, the more "N" increases, the more the way of changing the resonance wavelength of the multiple ring resonator increases.

The low reflection film of the laser diode chip may be abutted against the LD-side waveguide to be optically coupled, or the low reflection film of the laser diode chip may be optically coupled to the LD-side waveguide through an optical device. Like this, the structure for optically coupling the low reflection film of the laser diode chip and the LD-side waveguide can be selected in accordance with the condition.

In the plurality of ring resonators, diameters of the ring waveguides are set so that intervals of reflection peaks appearing periodically become different, and there generates resonance at a meeting point of reflection peaks. The tuning device changes refractive indexes of the ring-type waveguides of the ring resonators for changing the resonance wavelength. Specifically, the tuning device changes the refractive indexes of the ring-type waveguides by utilizing temperature properties of the ring-type waveguides.

Therefore, it is possible, with a simple structure without any external mirror that has been used conventionally, to achieve the tuning action over a wide range of wavelengths that cannot be achieved with a DFB-LD of the fixed wavelength. Furthermore, there is no movable part provided therein unlike the regular tunable laser of the external mirror type. Thus, high oscillation impact characteristic can be achieved in addition to achieving high reliability. Moreover, the change in the property over time is extremely smaller compared to the system that injects electric current to the semiconductor waveguide, since the refractive indexes of the ring-type waveguides are changed by utilizing the temperature properties of the ring-type waveguides for tuning the wavelengths.

There is further provided a wavelength detecting device for detecting the resonance wavelength of the multiple ring resonator. The wavelength detecting device may let through the light of only a specific range of wavelengths for detecting the wavelength. It is possible to learn the resonance wavelength of the multiple ring resonator by the wavelength detecting device.

A filter for letting through the light of only a specific range of wavelengths may be inserted at least to one place selected from the LD-side waveguide between the multiple ring resonator and the laser diode chip, the reflection-side waveguide between the multiple ring resonator and the high reflection film, and between the ring resonators. A light-receiving element may be provided to an end face that is extended from one end of the LD-side waveguide or an end face that is extended from one end of the reflection-side waveguide. The filter may let through the light of only a specific range of wavelengths so as to be detected by the light-receiving element. With the light-receiving element, the intensity of the laser light emitted from the LD chip can be monitored. Further, with the filter, it is possible to let through the laser light of a specific range of wavelengths.

It may be formed in a structure comprising a control device for feedback-controlling resonance of the multiple ring resonator based on resonance wavelength information detected by the wavelength detecting device. With this, feedback control can be executed in such a manner that the resonance wavelength becomes constant.

An end face extended from one end of the LD-side waveguide may be provided with a stray light suppressing part for suppressing influence of a stray light that is emitted from an end face extended from one end of the reflection-side waveguide. With this, influence of the stray light can be suppressed.

The laser diode chip may be mounted on the board by a passive alignment technique. The light-receiving element may be mounted on the board by the passive alignment technique. By the use of this method, the manufacturing process can be simplified through mounting each chip using only the alignment marks without monitoring the optical output.

With the tunable laser according to the present invention, the laser light of an extremely wide range of wavelengths can be obtained by mounting the LD chip on the board where the multiple ring resonator is formed and by changing the resonance wavelength through control of the temperature of the multiple ring resonator. Furthermore, it is highly reliable since there is no injection of electric current to the semiconductor laser and no mechanical movable member used therein. Moreover, it can be formed by simply mounting the LD chip on the board, so that it can be manufactured easily at low cost.

Furthermore, the use of the laser structure according to the present invention achieves the tuning action over a wide range of wavelengths that cannot be achieved with a regular DFB-LD, through a simple structure using no external mirror that has bee used conventionally. Furthermore, there is no movable part provided therein unlike the regular tunable laser of the external mirror type. Thus, high oscillation impact characteristic can be achieved in addition to achieving high reliability. Moreover, the change in the property over time is extremely smaller compared to the system that injects electric current to the semiconductor waveguide since the refractive indexes of the ring-type waveguides of the ring resonator are changed for tuning the wavelengths. As has been described above, the tunable laser according to the present invention is superior to the conventional tunable laser in many respects, and it can be manufactured at a low cost. Therefore, it is an extremely effective structure to be put into practical use.

BRIEF DESCRIPTION OF THE DRAWINGS

FIG. 2 shows tuning actions of the tunable laser of FIG. 1, in which FIG. 2 is a graph for showing a reflection spectrum of a ring resonator with a smaller diameter, FIG. 2 is a graph for showing a ring reflection spectrum of a resonator with a larger diameter, and FIG. 2 is a graph for showing a reflection spectrum of a double ring resonator;

FIG. 3 shows graphs of the reflection spectrum of the double ring resonator of the tunable laser shown in FIG. 1, in which FIG. 3 illustrates the case where the phase difference φ between the two ring resonators is 0.44 π, and FIG. 3 is the case where the phase difference φ between the two ring resonators is 1.76 π;

BEST MODE FOR CARRYING OUT THE INVENTION

Embodiments of the present invention will be described hereinafter by referring to the accompanying drawings.

Figure 1:
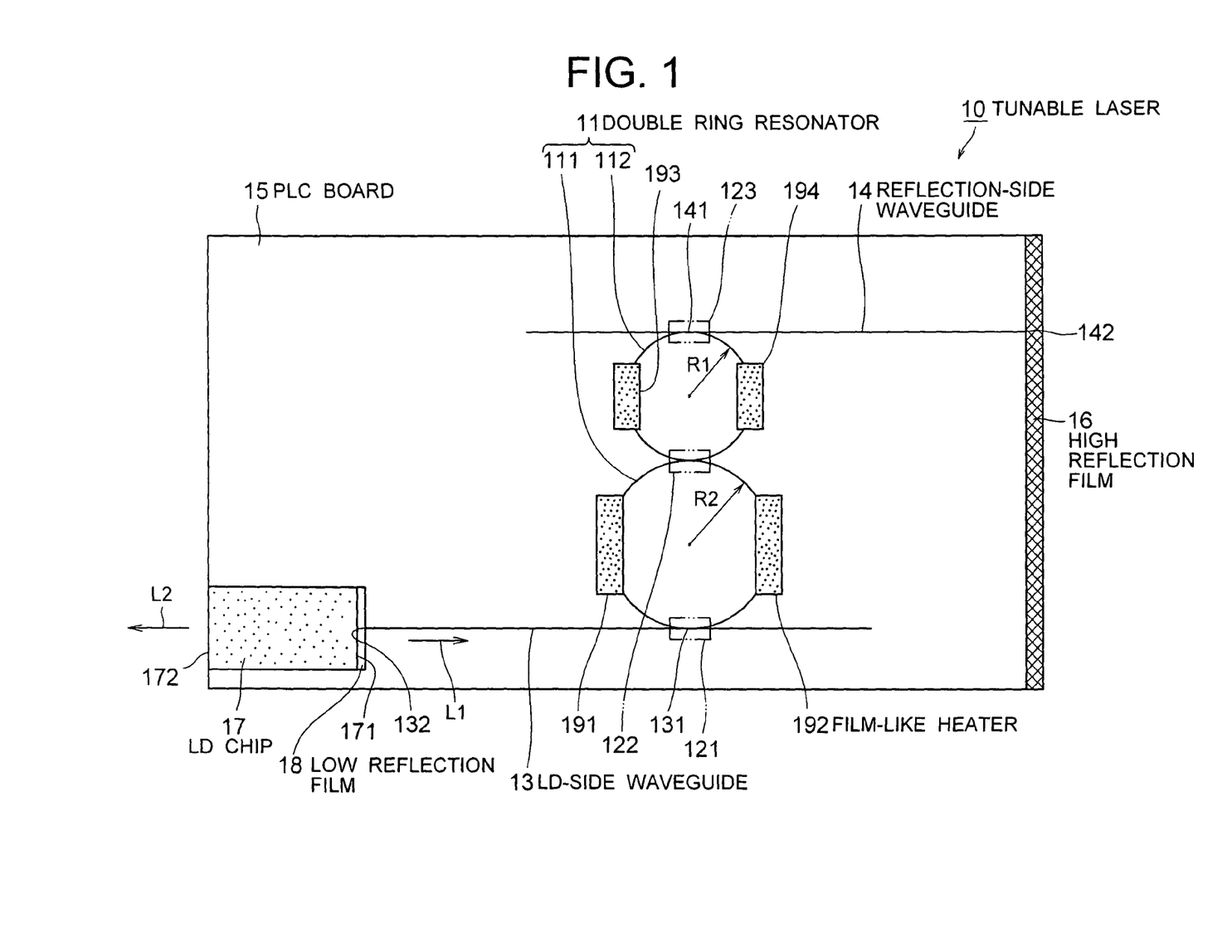
FIG. 1 is a plan view for showing a first embodiment of a tunable laser according to the present invention.

FIG. 1 is a plan view for showing a first embodiment of the tunable laser according to the present invention. There will be a description provided hereinafter by referring to this illustration.

A tunable laser 10 according to this embodiment comprises: a double ring resonator 11 in which ring resonators 111, 112 that are formed with ring-type waveguides of different optical path lengths from each other are coupled through a directional coupler 122; an LD-side waveguide 13 whose one end 131 is connected to the ring resonator 111 through a directional coupler 121; a reflection-side waveguide 14 whose one end 141 is connected to the ring resonator 112 through a directional coupler 123; a single PLC board 15 on which the ring resonators 111, 112, the LD-side waveguide 13, and the reflection-side waveguide 14 are formed; a high reflection film 16 provided on other end 142 of the reflection-side waveguide 14; an LD chip 17 formed on the PLC board 15, which has a low reflection film 18 formed on one (emission end face 171) of two opposing emission end faces 171, 172, and the low reflection film 18 abutted against other end 132 of the LD-side waveguide 13 to be optically coupled; and film-like heaters 191-194 for changing the resonance wavelength of the double ring resonator 11 by utilizing the temperature properties of the ring resonators 111 and 112. As the above-described waveguides, silica glasses and the like can be used.

The PLC board 15 is constituted by forming, on a silicon board, for example, a core layer to be waveguides and a clad layer to be used for those other than the waveguides by using micromachining technique such as CVD, photolithography, RIE. As the board, other board than the PLC board 15 may be used. As the material for the core layer and the clad layer, materials other than the silica material, such as polymer, photoconductor, may be used. The high reflection film 16 is made of a dielectric multilayer film or a metal film of gold or the like, which is formed on the side face of the PLC board 15. The high reflection film 16 may be any reflection film as long as it has a characteristic capable of reflecting the laser light sufficiently. A regular diode chip is used for the LD chip 17. The low reflection film 18 is a dielectric multilayer film, for example. The film-like heaters 191-194 are metal films of platinum, chromium, or the like, for example. Although not shown in the drawing, the film-like heaters 191-194 are provided with: wirings made of a gold film, which are connected to both ends of the film-like heaters 191-194; a power source for providing electricity to the wirings; and a controller and the like for controlling the output voltage or the output current of the power source. As the device for tuning the wavelengths, there are used the film-like heaters 191-194 that change the refractive indexes of the ring-type waveguides by utilizing the temperature properties of the ring-type waveguides of the ring resonators 111, 112. However, it is not intended to be limited to those. Instead of using the film-like heaters 191-194, it may be constituted to change the refractive indexes of the ring-type waveguides by utilizing the temperature properties of the ring-type waveguides of the ring resonators 111, 112 through heating/cooling. The point is that any device can be employed as long as it is capable of changing the resonance wavelengths through changing the refractive indexes of the ring-type waveguides of the ring resonators 111, 112. The use of the film-like heaters provided on the board as the tuning device makes it easy to obtain the device for tuning the wavelengths by simply forming a metal film, for example, on a board. Thus, it is easy to manufacture.

The LD chip 17 is directly mounted on the PLC board 15 by passive alignment technique. The passive alignment technique is a technique that determines positioning using mark pattern formed on the face of the PLC board 15 and the mark pattern of the LD chip 17. With this technique, alignment of the optical axis, which has been performed when manufacturing the optical module, becomes unnecessary. Thus, the cost and lead time for manufacturing the module can be improved dramatically.

Light L1 emitted from the LD chip 17 returns through the route of the low reflection film 18→the LD-side waveguide 13→the double ring resonator 11→the reflection-side waveguide 14→the high reflection film 16→the reflection-side waveguide 14→the double ring resonator 11→the LD-side waveguide 13→the low reflection film 18, and emitted as laser light L2 from the emission end face 172. The wavelength of this return light L2 is the resonance wavelength of the double ring resonator 11.

Figure 2:
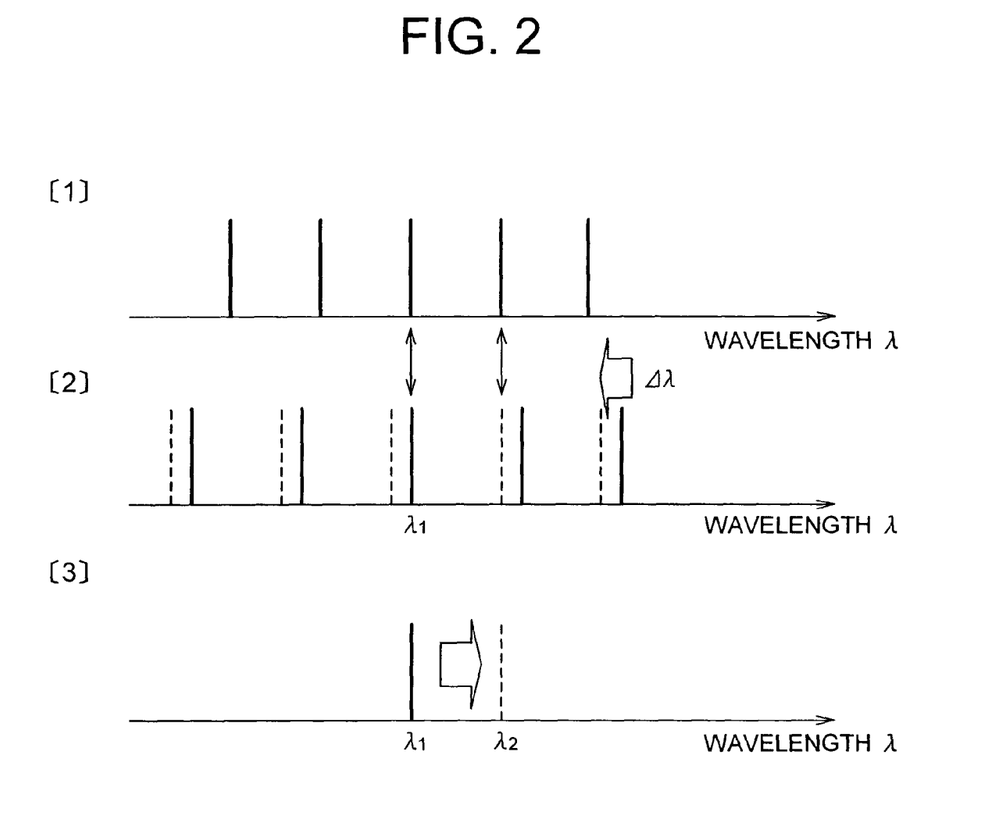

FIG. 2 shows tuning actions of the tunable laser 10, in which FIG. 2 is a graph for showing a reflection spectrum of the ring resonator 112 with a smaller diameter, FIG. 2 is a graph for showing a reflection spectrum of the ring resonator 111 with a larger diameter, and FIG. 2 is a graph for showing a reflection spectrum of the double ring resonator 11. The actions and effects of the tunable laser 10 will be described hereinafter by referring to FIG. 1 and FIG. 2.

The ring resonators 111 and 112 are constituted to induce resonance at the meeting point of the reflection peaks by setting the diameters of the ring-type waveguides in such a manner that the intervals of the reflections peaks appearing periodically become different. Specifically, as shown in FIGS. 2[1] and 2[2], diameters R1, R2 of the ring resonators 111, 112 are so set that the intervals of a great number of reflections peaks appearing periodically are slightly shifted. It is assumed here that he interval of the reflection peaks of the ring resonator 112 shown with a solid line is narrower than the interval of the reflection peaks of the ring resonator 111, and that the reflections peaks of the ring resonators 111 and 112 meet with each other at the wavelength λ1. In that state, the double ring resonator 11 generates resonance with the wavelength λ1 as shown in FIG. 2.

When the temperature of the ring resonator 111 is decreased by reducing the current amount applied to the film-like heaters 191, 192 from the state where they are heated by a certain current amount, the refractive index of the ring-type waveguide decreases. Thus, as shown with a broken line in FIG. 2, the reflection spectrum of the ring resonator 111 as a whole moves slightly towards the shortwave side. As a result, the reflections peaks of the ring resonators 111 and 112 meet with each other at the wavelength λ2. Thus, the double ring resonator 11 generates resonance at the wavelength λ2 as shown with a broken line in FIG. 2. Like this, the change in the wavelength of the reflection peak as shown by Δλ in FIG. 2 can cause the change in the wavelength from λ1 to λ2. For example, when the intervals of the reflections peaks of both the ring resonators 111, 112 are shifted by 10%, the move of the reflection peaks of the double ring resonator 11 due to the change in the refractive indexes appears as ten times the change in the resonance wavelength. By repeating it one after another, an extremely wide range of tunable wavelengths can be obtained, although it is intermittent. This is the same principle as that of the vernier dials that have been employed as dials for changing frequencies of slide calipers and old communication apparatuses. In addition, by moving the reflection spectrum of the other ring resonator 112 also through controlling the amount of current applied to the film-like heaters 193, 194, the wavelength can be changed continuously over an extremely wide range.

Figure 3:
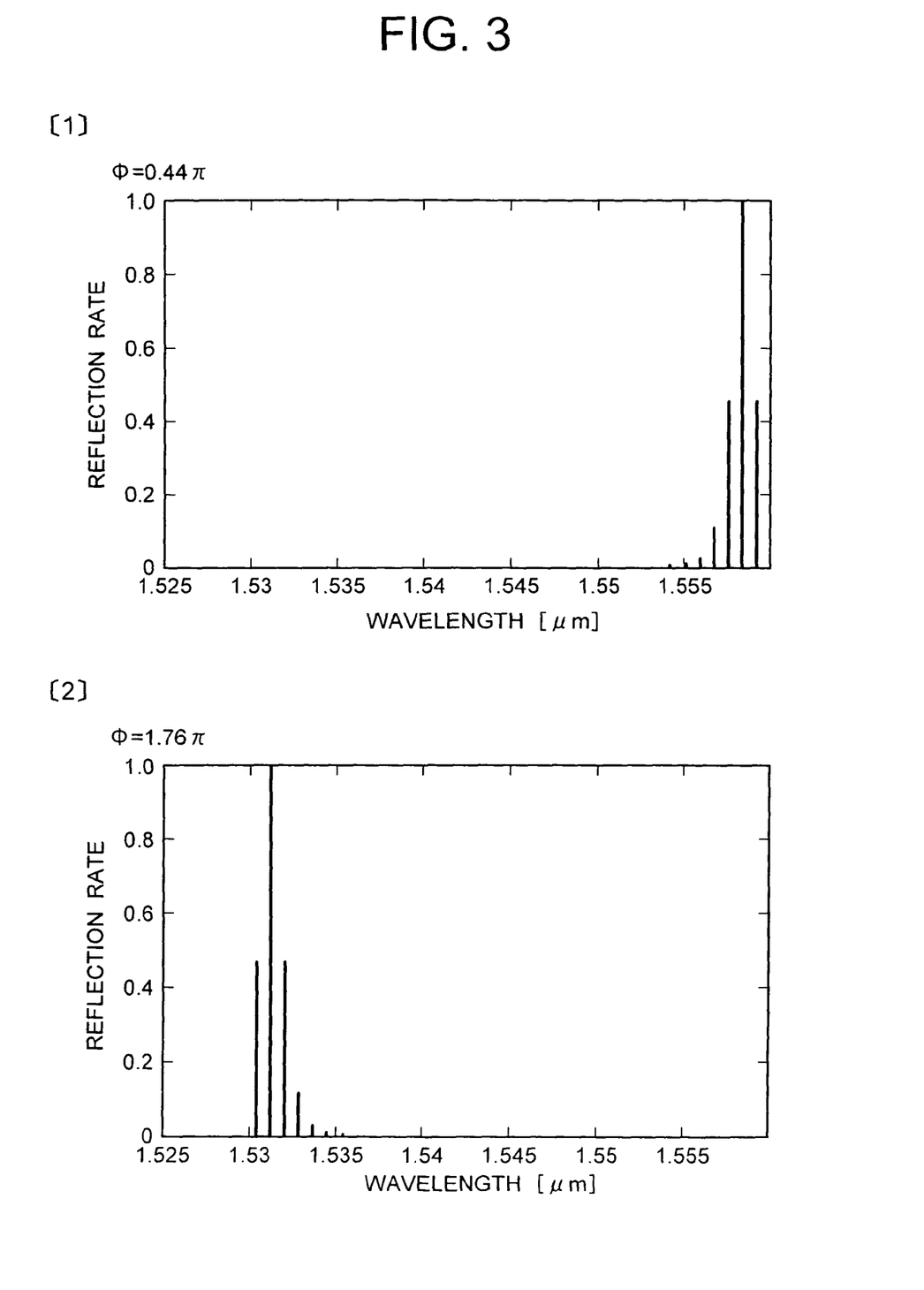

FIG. 3 shows graphs of the reflection spectrum of the double ring resonator 11, in which FIG. 3 illustrates the case where the phase difference φ between the ring resonators 111 and 112 is 0.44 π, and FIG. 3 is the case where the phase difference φ between the ring resonators 111 and 112 is 1.76 π. In the followings, the wavelength selecting mechanism and the tuning mechanism of the tunable laser 10 will be described in detail by referring to FIG. 1 and FIG. 3.

First, the light transmission function of the double ring resonator 11 can be found from a following expression.

$$H(\lambda) = \frac{A}{1 - B - C + D} \text{ where,} \quad \text{[Expression 1]}$$

$$A = \sqrt{\kappa_1 \kappa_2 \kappa_3}$$

$$B = \sqrt{1-\kappa_1}\sqrt{1-\kappa_2}\, e^{j\frac{2\pi}{\lambda}n\Delta L_1}$$

$$C = \sqrt{1-\kappa_2}\sqrt{1-\kappa_3}\, e^{j\frac{2\pi}{\lambda}n\Delta L_1 + j\phi}$$

$$D = \sqrt{1-\kappa_1}\sqrt{1-\kappa_3}\, e^{j\frac{2\pi}{\lambda}n(\Delta L_1 + \Delta L_2) + j\phi}$$

It is noted that: κ1, κ2, κ3 indicate the branching ratios of the directional coupler 121, 122, 123 that are provided in the double ring resonator 11; λ is the wavelength; n is the waveguide equivalent refractive index; ΔL1 is the circumferential length of the ring resonator 112; ΔL2 is the circumferential length of the ring resonator 111; and φ indicates the phase difference between the ring resonators 111 and 112, respectively. FIG. 3 shows the calculated result of the reflection spectrums when the light is returned from the high reflection film 16, on condition that κ1=κ3=0.1296, κ2=0.0081, ΔL1=2000 μm, and ΔL2=2040 μm.

As shown in FIG. 3, when it is set as φ=0.44 π, the reflection peak appears in the vicinity of 1.56 μm. In the meantime, when it is set as φ=1.76 π, the reflection peak appears in the vicinity of 1.53 μm as shown in FIG. 3. Thus, it is possible to move the reflection peak over the entire region of C-band (1.53 μm-1.56 μm) by the phase change of almost π. The tuning action of the wavelengths over the wide range through the phase change of π is made possible because the two ring resonators 111, 112 having slightly different circumferential lengths, i.e. the diameters R1 and R2, are connected in series and the Vernier effect generated thereby is utilized cleverly. It is because the FSRs of the ring resonators 111, 112 connected in series differ slightly, so that there generates still larger reflection at the wavelength (resonance wavelength) where the periodic changes of the reflections (transmissions) generated in each of the ring resonators 111, 112 meet with each other. Thereby, the wavelength where the periods become consistent changes largely according to the circumferential lengths and the changes in the guide wave refractive indexes of the ring resonators 111, 112. Thus, efficient tuning action can be expected. As mentioned in the foregoing calculation, the phase change that is necessary even for the tuning action conducted over the entire region of the C-band is about π. This is a value that can be achieved with the change in the temperatures through applying electricity by a heater of about 80° C. for the case of the silica waveguide.

In this embodiment, the reflection property of the double ring resonator 11 described herein is used as a wavelength selecting mechanism of the LD for achieving the tuning action. Specifically, the temperature is increased locally through supplying electricity to the film-like heaters 191-194 provided right above the ring-type waveguides that constitute the ring resonators 111 and 112. By the control of the temperatures, the reflection amount at a desired wavelength can be increased, thereby achieving laser oscillation at that wavelength. As has been described above, with the structure of the embodiment, the wavelength of the reflection peak can be shifted over the entire regions of the C-band or L-band (1.56 μm-1.59 μm) through supplying electricity to the film-like heaters 191-194. Thereby, the tuning action can be performed over a still wider range of wavelengths.

Figure 4:
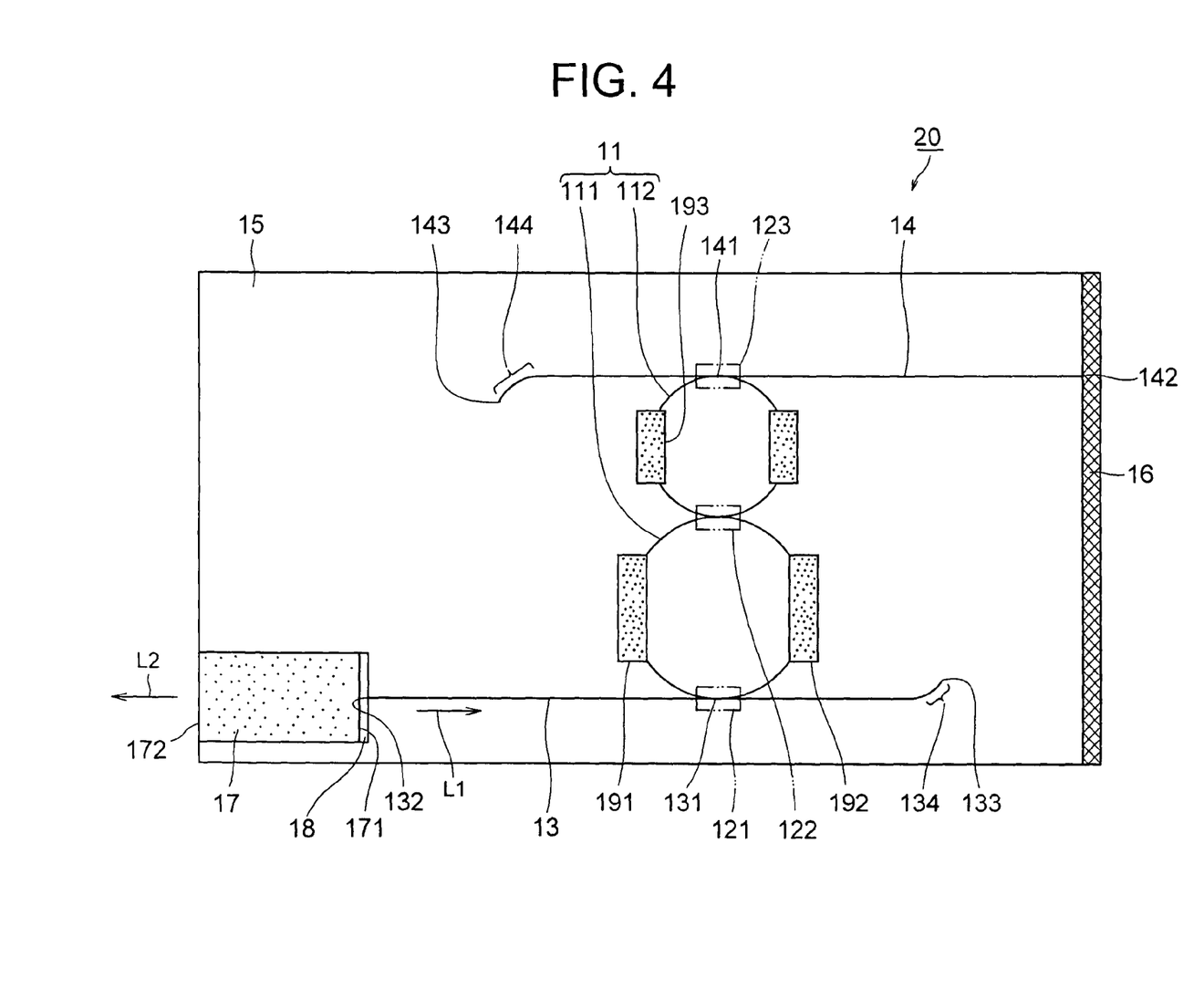
FIG. 4 is a plan view for showing a second embodiment of the tunable laser according to the present invention.

FIG. 4 is a plan view for showing a second embodiment of the tunable laser according to the present invention. There will be description provided hereinafter by referring to the drawing. The same reference numerals are applied to the same components as those of FIG. 1, and the description thereof will be omitted.

The tunable laser 20 according to this embodiment comprises bent parts 134, 144 formed at one end 131 of the LD-side waveguide 13 and one end 141 of the reflection-side waveguide 14 for directing, towards a prescribed direction, the end faces 133, 143 that are extended therefrom. With this, stray lights emitted from the end faces 134 and 143 can be guided towards the direction of less influence.

The bent parts 134 and 144 are used as the stray light suppressing parts in FIG. 4. However, it is not intended to be limited to those. Any stray light suppressing parts may be used as long as they can suppress the influence of the stray lights emitted from the end face that is extended from one end of the LD-side waveguide or from the end face that is extended from one end of the reflection-side waveguide.

Figure 5:
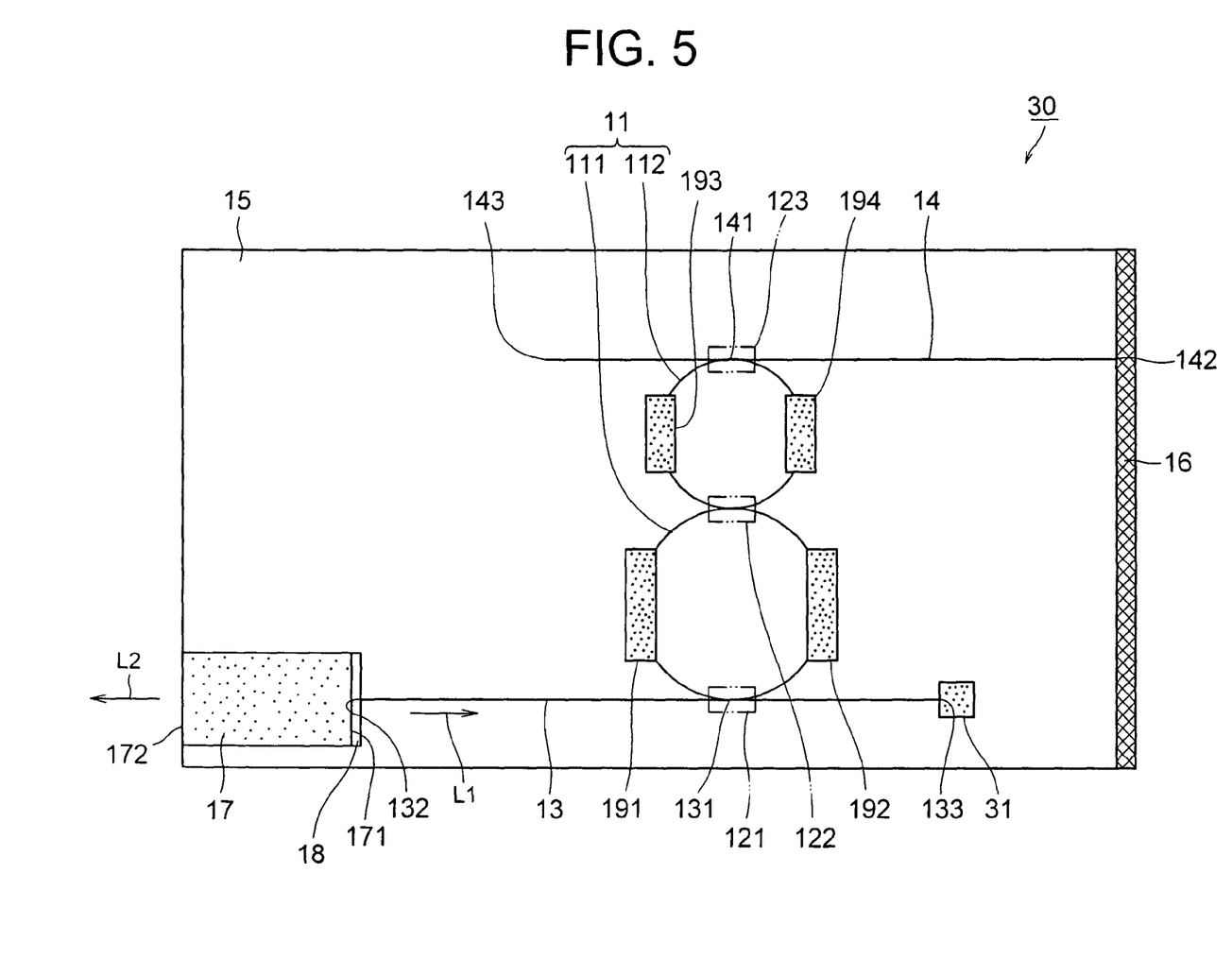
FIG. 5 is a plan view for showing a third embodiment of the tunable laser according to the present invention.

FIG. 5 is a plan view for showing a third embodiment of the tunable laser according to the present invention. There will be description provided hereinafter by referring to the drawing. The same reference numerals are applied to the same components as those of FIG. 1, and the description thereof will be omitted.

The tunable laser 30 according to this embodiment comprises a light-receiving element 31 provided on the end face 133 that is extended from one end 131 of the LD-side waveguide 13. The intensity of the laser light L2 emitted from the LD chip 17 can be monitored with the light-receiving element 31. The light-receiving element 31 is a photodiode, for example, and it is directly mounted on the PLC board 15 along with the LD chip 17 by the passive alignment technique. The light-receiving element 31 may be provided to the end face 143 that is extended from one end 141 of the reflection-side waveguide 14.

Figure 6:
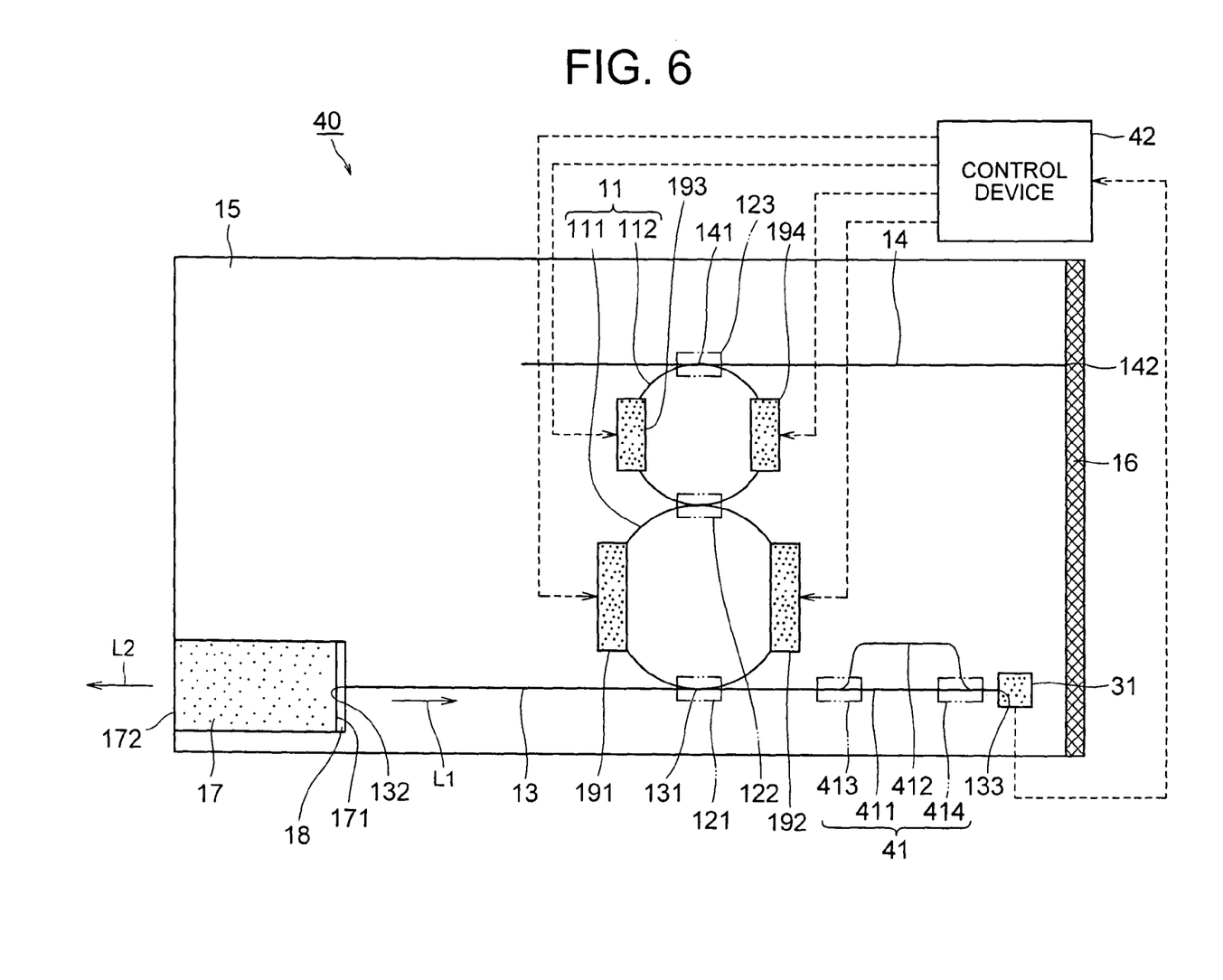
FIG. 6 is a plan view for showing a fourth embodiment of the tunable laser according to the present invention.

FIG. 6 is a plan view for showing a fourth embodiment of the tunable laser according to the present invention. There will be description provided hereinafter by referring to the drawing. The same reference numerals are applied to the same components as those of FIG. 1 and FIG. 5, and the description thereof will be omitted.

The tunable laser 40 according to this embodiment comprises a light-receiving element 31 provided on the end face 133 that is extended from one end 131 of the LD-side waveguide 13. In addition, it comprises: a nonsymmetrical Mach-Zehnder interferometer 41 for letting through the light of only a specific range of wavelengths, which is inserted into the LD-side waveguide 13 between the light-receiving element 31 and the double ring resonator 11; and a control device 42 for controlling the supply of electricity to the film-like heaters 191-194 so that the intensities of the light detected by the light-receiving element 31 become constant.

The nonsymmetrical Mach-Zehnder interferometer 41 has a structure in which a short waveguide 411 and a long waveguide 412 are connected in parallel through directional couplers 413, 414, and it functions as a filter that utilizes interference generated due to the difference between the optical path lengths of the waveguides 411 and 412. Further, the nonsymmetrical Mach-Zehnder interferometer 41 can be formed on the PLC board 15 simultaneously with other waveguides. The control device 42 is an ordinal type that is constituted with a microcomputer such as DSP, an AD converter, a DA converter, an amplifier, and the like, for example.

The nonsymmetrical Mach-Zehnder interferometer 41 and the light-receiving element 31 let through the light of a specific range of the wavelengths, and function as the wavelength detecting device for detecting the resonance wavelength of the double ring resonator 11. The nonsymmetrical Mach-Zehnder interferometer 41 and the light-receiving element 31 may be provided to the reflection-side waveguide 14.

In this embodiment, the control device 42 performs feedback-control of the resonance of the double ring resonator 11 based on the resonance wavelength information detected by the wavelength detecting devices (31, 41).

Figure 7:
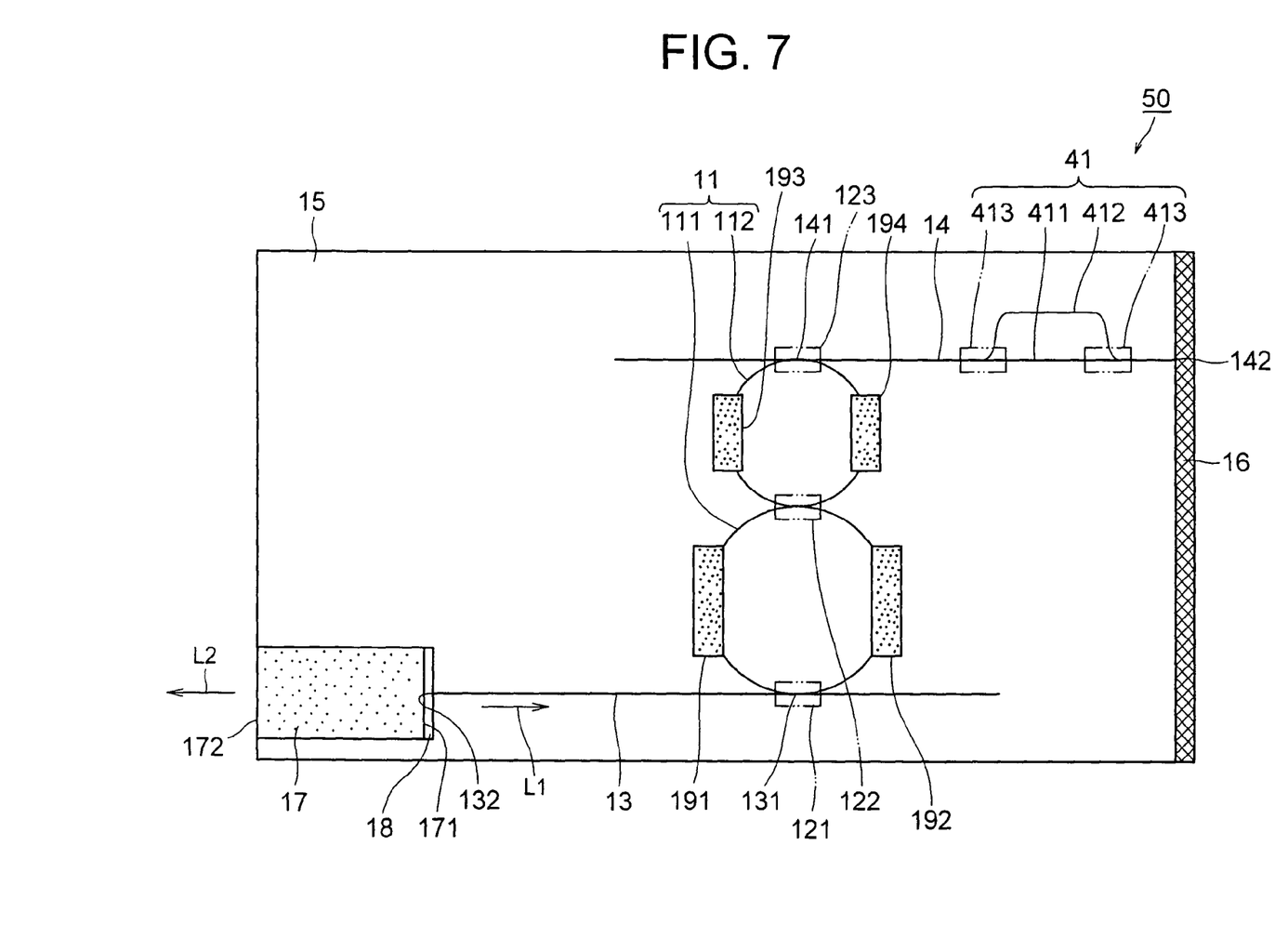
FIG. 7 is a plan view for showing a fifth embodiment of the tunable laser according to the present invention.

FIG. 7 is a plan view for showing a fifth embodiment of the tunable laser according to the present invention. There will be description provided hereinafter by referring to the drawing. The same reference numerals are applied to the same components as those of FIG. 1 and FIG. 6, and the description thereof will be omitted.

The tunable laser 50 according to this embodiment comprises the nonsymmetrical Mach-Zehnder interferometer 41 inserted into the reflection-side waveguide 14 between the double ring resonator 11 and the high reflection film 16. The nonsymmetrical Mach-Zehnder interferometer 41 functions as a filter for letting through the light of only a specific range of wavelengths. With this filter function, only the light with a specific range of wavelengths from the double ring resonator 11 passes through the nonsymmetrical Mach-Zehnder interferometer 41. The wavelength of the light corresponds to the resonance wavelength of the double ring resonator 11. The nonsymmetrical Mach-Zehnder interferometer 41 may be inserted anywhere between the ring resonators or the like where the light travels back and forth.

Figure 8:
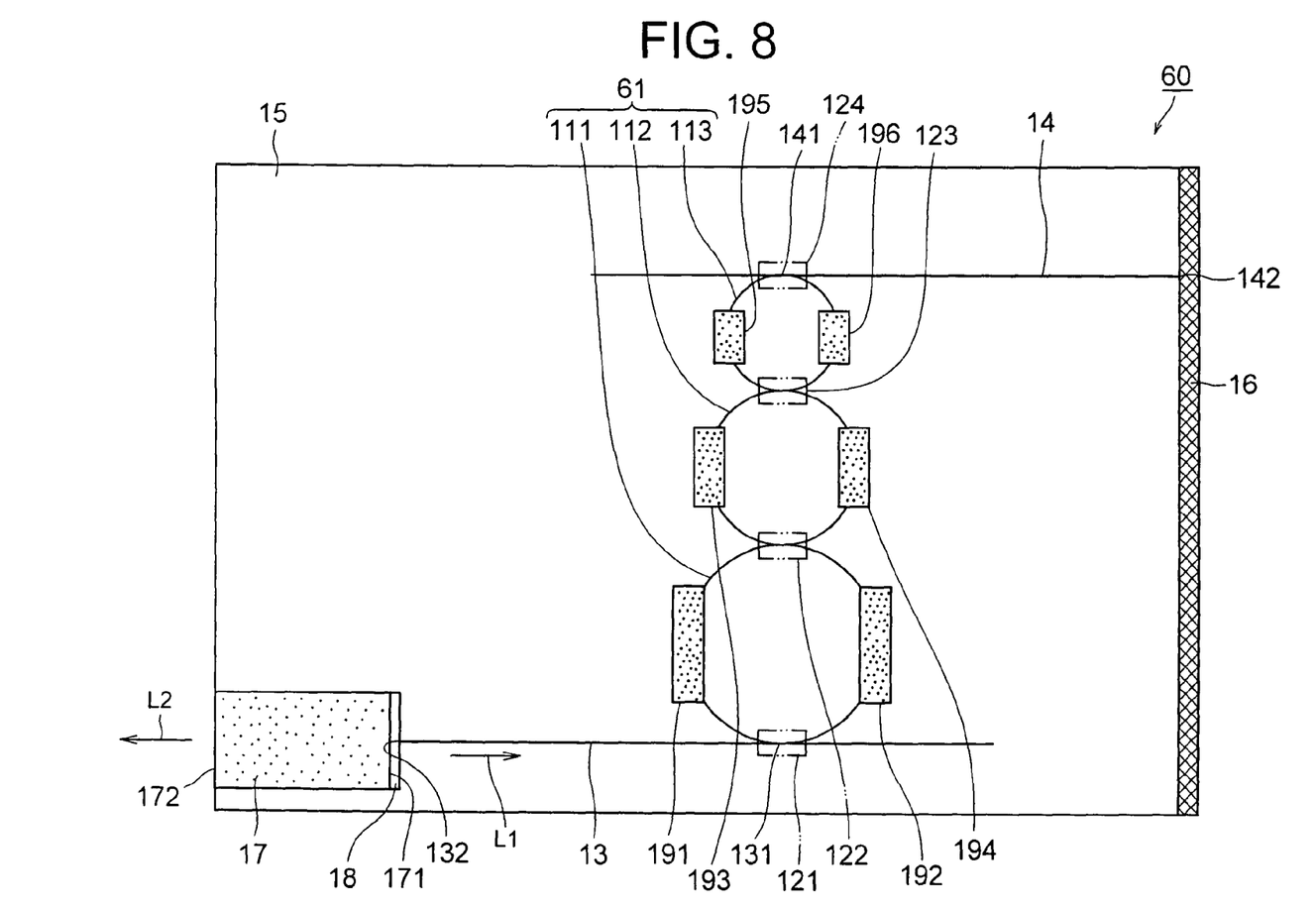
FIG. 8 is a plan view for showing a sixth embodiment of the tunable laser according to the present invention.

FIG. 8 is a plan view for showing a sixth embodiment of the tunable laser according to the present invention. There will be description provided hereinafter by referring to the drawing. The same reference numerals are applied to the same components as those of FIG. 1, and the description thereof will be omitted.

The tunable laser 60 according to this embodiment comprises: a triple ring resonator 61 in which ring resonators 111, 112, 113 that are formed with ring-type waveguides of different optical path lengths from each other are coupled through directional couplers 122, 123; an LD-side waveguide 13 whose one end 131 is connected to the ring resonator 111 through a directional coupler 121; a reflection-side waveguide 14 whose one end 141 is connected to the ring resonator 113 through a directional coupler 124; a single PLC board 15 on which the ring resonators 111, 112, 113, the LD-side waveguide 13, and the reflection-side waveguide 14 are formed; a high reflection film 16 provided on other end 142 of the reflection-side waveguide 14; an LD chip 17 formed on the PLC board 15, which has a low reflection film 18 formed on one (emission end face 171) of two opposing emission end faces 171, 172, and the low reflection film 18 connected to other end 132 of the LD-side waveguide 13; and film-like heaters 191-196 for changing the resonance wavelength of the triple ring resonator 61 by utilizing the temperature properties of the ring resonators 111, 112, 113. As the above-described waveguides, silica glasses and the like can be used.

The multiple ring resonator in this embodiment is the triple ring resonator 61. The triple ring resonator 61 resonates with the wavelength that is the resonance wavelength consistent for all the three ring resonators 111, 112, 113. In other words, since the temperatures of the three ring resonator 111, 112, and 113 can be controlled, it is possible to provide various methods for changing the resonance wavelength of the triple ring resonator 61.

Figure 9:
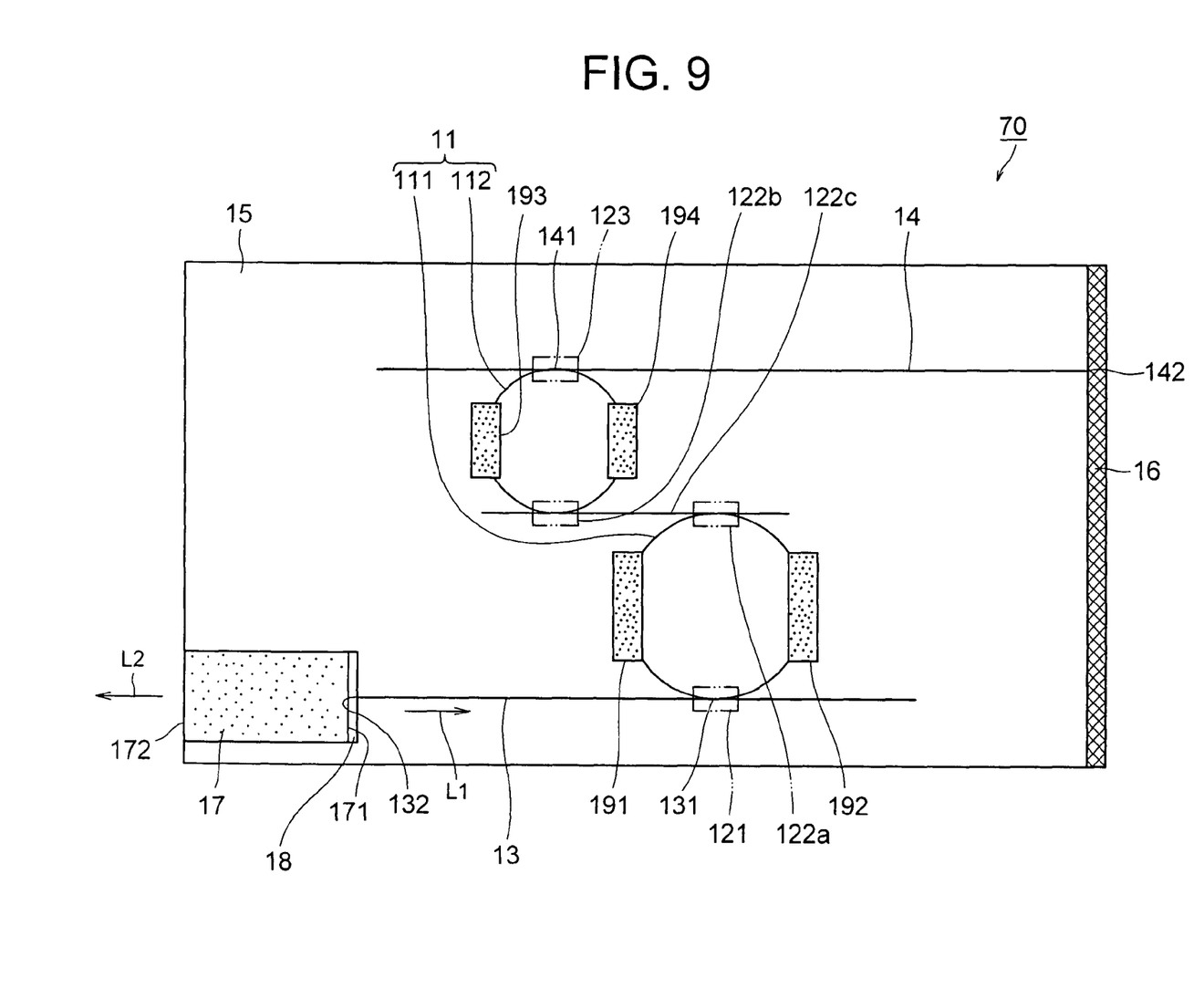
FIG. 9 is a plan view for showing a seventh embodiment of the tunable laser according to the present invention.

FIG. 9 is a plan view for showing a seventh embodiment of the tunable laser according to the present invention. There will be description provided hereinafter by referring to the drawing. The same reference numerals are applied to the same components as those of FIG. 1, and the description thereof will be omitted.

The tunable laser 70 according to this embodiment comprises: a double ring resonator 11 in which ring resonators 111, 112 that are formed with ring-type waveguides of different optical path lengths from each other are coupled through directional couplers 122a, 122b and a straight waveguide 122c; an LD-side waveguide 13 whose one end 131 is connected to the ring resonator 111 through a directional coupler 121; a reflection-side waveguide 14 whose one end 141 is connected to the ring resonator 112 through a directional coupler 123; a single PLC board 15 on which the ring resonators 111, 112, the LD-side waveguide 13, and the reflection-side waveguide 14 are formed; a high reflection film 16 provided on other end 142 of the reflection-side waveguide 14, an LD chip 17 formed on the PLC board 15, which has a low reflection film 18 formed on one (emission end face 171) of two opposing emission end faces 171, 172, and the low reflection film 18 connected to other end 132 of the LD-side waveguide 13; and film-like heaters 191-194 for changing the resonance wavelength of the double ring resonator 11 by utilizing the temperature properties of the ring resonators 111 and 112. As the above-described waveguides, silica glasses and the like can be used.

As the optical-coupling device for coupling the ring resonators 111 and 112, the embodiment uses the straight waveguide 122c instead of the directional couplers. The point is that the directional coupler or the waveguide may be used for the optical-coupling device for coupling a plurality of ring resonators 111 and 112.

Figure 10:
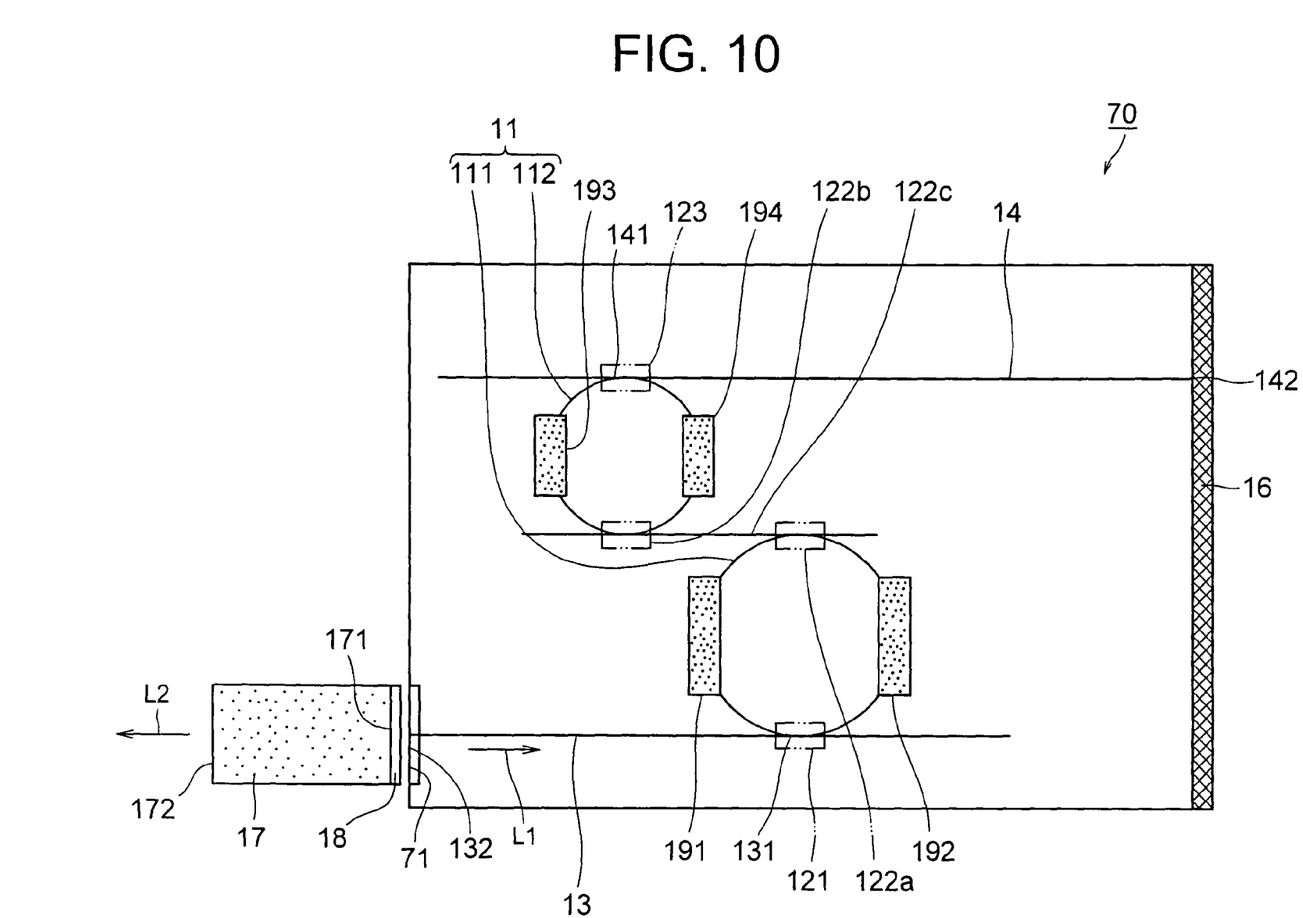
FIG. 10 is a plan view for showing an eighth embodiment of the tunable laser according to the present invention.
Figure 11:
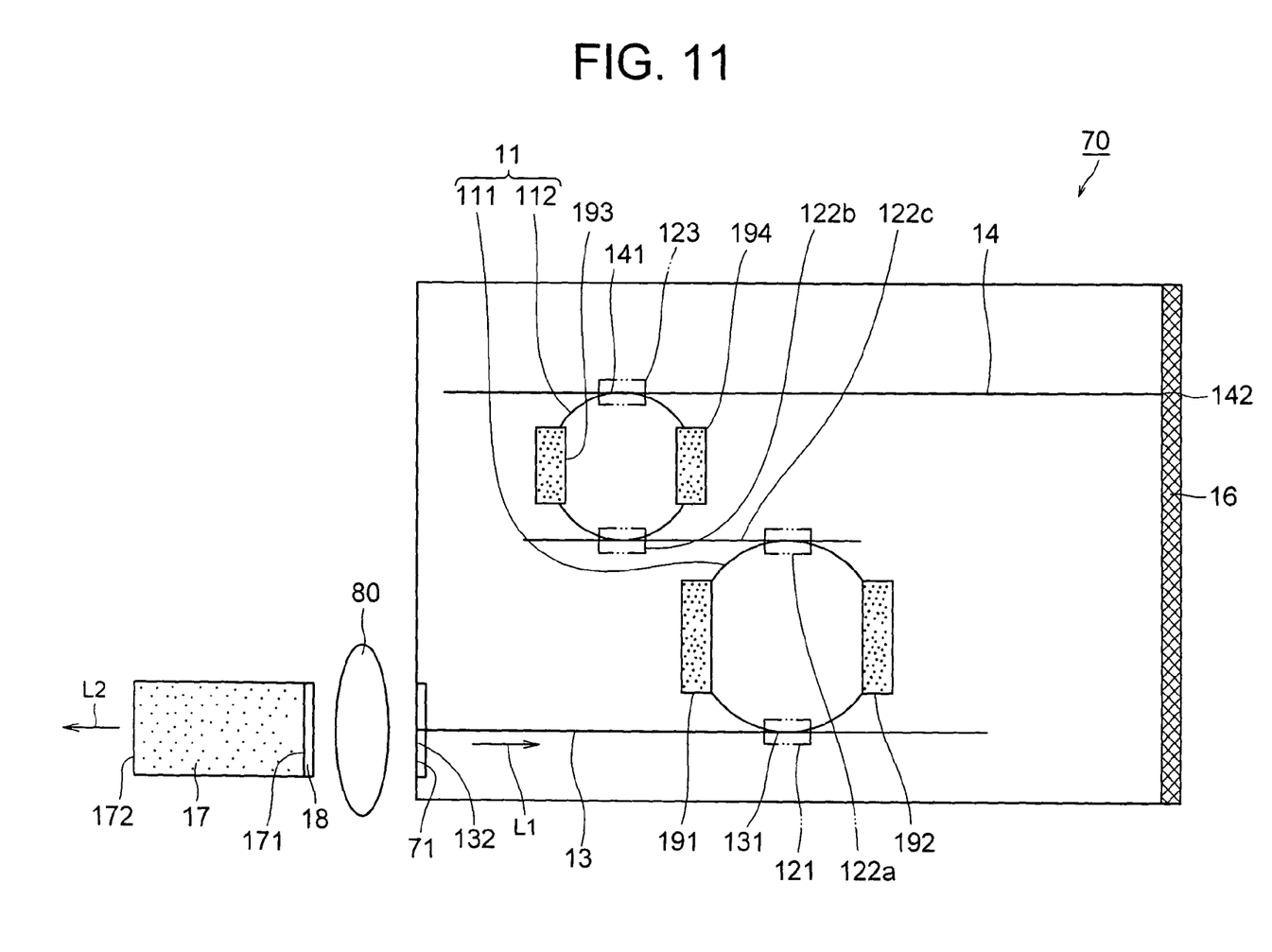
FIG. 11 is a plan view for showing a ninth embodiment of the tunable laser according to the present invention.

FIG. 10 is a plan view for showing an eighth embodiment of the tunable laser according to the present invention. FIG. 11 is a plan view for showing a ninth embodiment of the tunable laser according to the present invention. There will be description provided hereinafter by referring to the drawings. The same reference numerals are applied to the same components as those of FIG. 1 and FIG. 9, and the description thereof will be omitted.

The embodiments shown in FIG. 1 and FIG. 4-FIG. 9 are described by referring to the case where the LD chip 17 is mounted on the board 15. However, it is not limited to this. As shown In FIG. 10 and FIG. 11, the LD chip 17 may be provided by being separated from the board.

In the embodiment shown in FIG. 10, the LD chip 17 is provided by being separated from the board 15. The low reflection film 18 of the LD chip 17 and the LD-side waveguide 13 are abutted against each other to be optically coupled. The low reflection film 18 of the LD chip 17 and the LD-side waveguide 13 are mounted precisely with a space of 30 μm or less provided therebetween. The low reflection film 18 of the LD chip 17 may be fitted closely with the LD-side waveguide 13 to be optically coupled.

The embodiment shown in FIG. 10 is effective for the case where the LD chip 17 is mounted on another board and the like. Furthermore, since the low reflection film 18 of the LD chip 17 is abutted against the LD-side waveguide 13 to be optically coupled, the dimension therebetween can be shortened.

Like the embodiment shown in FIG. 10, the LD chip 17 is provided by being separated from the board 15 in the embodiment shown in FIG. 11. The low reflection film 18 of the LD chip 17 is optically coupled to the LD-side waveguide 13 through an optical-coupling device 80 such as a lens. The optical-coupling device 80 enables alignment of the light spot size of the low reflection film 18 of the LD chip 17 and that of the LD-side waveguide 13.

Like the embodiment shown in FIG. 10, the embodiment shown in FIG. 11 is effective for the case where the LD chip 17 is mounted on another board and the like. In addition, it allows dramatic reduction of the optical-coupling loss at the optically coupled part between the low reflection film 18 of the LD chip 17 and the LD-side waveguide 13.

In the above, each embodiment has been described independently. However, the structures of those embodiments can be combined as necessary.

The invention claimed is:

1. A tunable laser, comprising: a multiple ring resonator in which a plurality of ring resonators, which are constituted with ring-type waveguides having optical path lengths different from each other, are directly coupled through an optical-coupling device; an LD-side waveguide having a first end connected to one of the plurality of ring resonators through an optical-coupling device; a reflection-side waveguide having a first end connected to other one of the plurality of ring resonators through an optical-coupling device; a single board on which the ring resonator, the LD-side waveguide and the reflection-side waveguide are formed; a reflection film provided to a second end of the reflection-side waveguide, wherein said reflection film comprises a high-reflection film capable of reflecting laser light without regard to a wavelength of a transmission peak of said laser light; a laser diode chip having a low reflection film formed on one of two opposing emission end faces, which is optically coupled to the LD-side waveguide through the low reflection film; and a tuning device comprising a plurality of heaters on each of the ring resonators for changing a resonance wavelength of only the multiple ring resonator, wherein, in the plurality of ring resonators, diameters of the ring waveguides are set so that intervals of reflection peaks appearing periodically become different, and there generates a resonance at a meeting point of the reflection peaks.

2. The tunable laser as claimed in claim 1, wherein the multiple ring resonator contains at least two or more of the ring resonators.

3. The tunable laser as claimed in claim 1, wherein the low reflection film of the laser diode chip is abutted against the LD-side waveguide to be optically coupled.

4. The tunable laser as claimed in claim 1, wherein the low reflection film of the laser diode chip is optically coupled to the LD-side waveguide through an optical device.

5. The tunable laser as claimed in claim 4, wherein the optical device comprises a lens.

6. The tunable laser as claimed in claim 1, wherein the optical coupling devices comprise directional couplers.

7. The tunable laser as claimed in claim 1, further comprising a wavelength detecting device for detecting a resonance wavelength of the multiple ring resonator.

8. The tunable laser as claimed in claim 7, wherein the wavelength detecting device lets through or shields light of only a specific range of wavelengths to detect the wavelength.

9. The tunable laser as claimed in claim 7, comprising a control device for feedback-controlling resonance of the multiple ring resonator based on resonance wavelength information detected by the wavelength detecting device.

10. The tunable laser as claimed in claim 1, wherein a stray light suppressing part for suppressing influence of a stray light that is emitted from an end face extended from one end of the LD-side waveguide or an end face extended from one end of the reflection-side waveguide is provided.

11. The tunable laser as claimed in claim 1, wherein a filter for letting through light of only a specific range of wavelengths is inserted at least to one place selected from the LD-side waveguide between the multiple ring resonator and the laser diode chip, the reflection-side waveguide between the multiple ring resonator and the high reflection film, and between the ring resonators.

12. The tunable laser as claimed in claim 1, wherein a light-receiving element is provided to an end face that is extended from one end of the LD-side waveguide or an end face that is extended from one end of the reflection-side waveguide.

13. The tunable laser as claimed in claim 1, wherein the laser diode chip is mounted on the board by a passive alignment technique which thereby renders alignment of the optical axis unnecessary.

14. The tunable laser as claimed in claim 12, wherein the light-receiving element is mounted on the board by a passive alignment technique which thereby renders alignment of the optical axis unnecessary.

15. The tunable laser as claimed in claim 1, wherein the reflection film comprises one of a dielectric multilayer film and a metal film.

16. The tunable laser as claimed in claim 1, wherein the reflection film reflects laser light without tuning regardless of said changed resonance wavelength of said multiple ring resonator.

17. The tunable laser as claimed in claim 11, wherein a feedback control is executed such that the resonance wavelength becomes constant.

18. The tunable laser as claimed in claim 1, wherein a wavelength of said reflection peak can be shifted over entire regions of the C-band and L-band (1.53 micron-1.625 micron).

19. A tunable laser, comprising: a multiple ring resonator in which a plurality of ring resonators, which are constituted with ring-type waveguides having optical path lengths different from each other, are directly coupled through an optical-coupling device; an LD-side waveguide having a first end connected to one of the plurality of ring resonators through an optical-coupling device; a reflection-side waveguide having a first end connected to other one of the plurality of ring resonators through an optical-coupling device; a single board on which the ring resonator, the LD-side waveguide and the reflection-side waveguide are formed; a reflection film provided to a second end of the reflection-side waveguide, wherein said reflection film comprises a high-reflection film capable of reflecting laser light without regard to a wavelength of a transmission peak of said laser light; a laser diode chip having a low reflection film formed on one of two opposing emission end faces, which is optically coupled to the LD-side waveguide through the low reflection film; and a tuning device comprising a plurality of heaters on each of the ring resonators for changing a resonance wavelength of only the multiple ring resonator, wherein the tuning device changes refractive indexes of the ring-type waveguides of the ring resonators for changing the resonance wavelength, wherein the tuning device changes the resonance wavelength of the ring-type waveguides only by temperature-adjusting a refractive index of each of the ring-type waveguides, and wherein the refractive indexes of each of the ring-type waveguides are temperature-adjusted independently of each other.

20. A tunable laser, comprising: a multiple ring resonator in which a plurality of ring resonators, which are constituted with ring-type waveguides having optical path lengths different from each other, are directly coupled through an optical-coupling device; an LD-side waveguide having a first end connected to one of the plurality of ring resonators through an optical-coupling device; a reflection-side waveguide having a first end connected to other one of the plurality of ring resonators through an optical-coupling device; a single board on which the ring resonator, the LD-side waveguide and the reflection-side waveguide are formed; a reflection film provided to a second end of the reflection-side waveguide, wherein said reflection film comprises a high-reflection film capable of reflecting laser light without regard to a wavelength of a transmission peak of said laser light; a laser diode chip having a low reflection film formed on one of two opposing emission end faces, which is optically coupled to the LD-side waveguide through the low reflection film; and a tuning device comprising a plurality of heaters on each of the ring resonators for changing a resonance wavelength of only the multiple ring resonator, wherein the tuning device changes refractive indexes of the ring-type waveguides of the ring resonators for changing the resonance wavelength, wherein, in the plurality of ring resonators, diameters of the ring waveguides are set so that intervals of reflection peaks appearing periodically become different, and there generates a resonance at a meeting point of the reflection peaks.

* * * * *